United States Patent
Cariou et al.

(10) Patent No.: US 9,844,149 B2
(45) Date of Patent: Dec. 12, 2017

(54) WIRELESS COMMUNICATIONS ANTENNA ASSEMBLY

(71) Applicant: Logitech Europe S.A., Morges (CH)

(72) Inventors: Laurent Cariou, Vertsonnex (FR);
Frédéric Fortin, Annemasse (FR);
Darragh Luttrell, Glanmire (IE);
Vilasinh Vilaylack, Prevessin-Moens (FR)

(73) Assignee: Logitech Europe S.A., Lausanne (CH)

( * ) Notice: Subject to any disclaimer, the term of this patent is extended or adjusted under 35 U.S.C. 154(b) by 437 days.

(21) Appl. No.: 13/671,348

(22) Filed: Nov. 7, 2012

(65) Prior Publication Data

US 2014/0028502 A1 Jan. 30, 2014

Related U.S. Application Data (60) Provisional application No. 61/676,778, filed on Jul. 27, 2012.

(51) Int. Cl.
| | |
|---|---|
| *H01Q 9/04* | (2006.01) |
| *H05K 3/30* | (2006.01) |
| *H01Q 1/44* | (2006.01) |
| *H01Q 1/22* | (2006.01) |
| *H01Q 9/42* | (2006.01) |

(Continued)

(52) U.S. Cl.
CPC ............. *H05K 3/30* (2013.01); *H01Q 1/2275* (2013.01); *H01Q 1/44* (2013.01); *H01Q 9/42* (2013.01); *H05K 1/18* (2013.01); *H05K 3/3405* (2013.01); *H05K 2201/09063* (2013.01); *H05K 2201/10098* (2013.01); *H05K 2201/10287* (2013.01); *H05K 2201/10446* (2013.01); *Y10T 29/4913* (2015.01); *Y10T 29/49144* (2015.01)

(58) Field of Classification Search
CPC .......... H01Q 1/2275; H01Q 1/38; H01Q 9/30; F16B 2/20; H05K 7/1409; H05K 7/02
USPC .............................. 29/600, 601; 343/700 MS
See application file for complete search history.

(56) References Cited

U.S. PATENT DOCUMENTS

| | | | |
|---|---|---|---|
| 6,545,643 B1 * | 4/2003 | Sward et al. | ................. 343/702 |
| 7,359,208 B2 | 4/2008 | Ni | |
| 7,407,390 B1 | 8/2008 | Ni | |

(Continued)

FOREIGN PATENT DOCUMENTS

| | | | |
|---|---|---|---|
| CN | 2750495 Y | 1/2006 | |
| CN | 101060197 | * 10/2007 | ............... H01Q 5/00 |

(Continued)

OTHER PUBLICATIONS

Translation of Chen CN 101060197.*

(Continued)

*Primary Examiner* — Dameon E Levi
*Assistant Examiner* — David Lotter
(74) *Attorney, Agent, or Firm* — Kilpatrick Townsend & Stockton LLP (57) ABSTRACT

A method for constructing a wireless communications apparatus includes attaching a three dimensional antenna having a first end and a second end to a printed circuit board (PCB) using a spring-loaded attachment mechanism. The three dimensional antenna is attached in an orientation that is perpendicular to a mounting surface of the PCB. The first end of the three dimensional antenna is further soldered to the PCB.

14 Claims, 14 Drawing Sheets

(51) Int. Cl.
*H05K 1/18* (2006.01)
*H05K 3/34* (2006.01)

(56) References Cited

U.S. PATENT DOCUMENTS

| | | | |
|---|---|---|---|
| 7,748,995 B1 | 7/2010 | Lee | |
| 7,824,227 B1 | 11/2010 | Lee et al. | |
| 7,833,056 B1 | 11/2010 | Lee et al. | |
| 2003/0107881 A1* | 6/2003 | Muramatsu et al. | 361/818 |
| 2006/0214852 A1 | 9/2006 | Noro et al. | |
| 2010/0164811 A1 | 7/2010 | Cheng et al. | |
| 2010/0188292 A1* | 7/2010 | Rutfors | 343/700 MS |
| 2010/0267285 A1 | 10/2010 | Wang | |
| 2010/0315297 A1 | 12/2010 | Wu et al. | |
| 2011/0039426 A1 | 2/2011 | Lee | |
| 2011/0260030 A1* | 10/2011 | Calearo | H01Q 1/1214 248/534 |
| 2012/0008268 A1 | 1/2012 | Jiang et al. | |
| 2012/0162024 A1 | 6/2012 | Yang et al. | |
| 2012/0212377 A1 | 8/2012 | He et al. | |
| 2013/0194156 A1 | 8/2013 | Iellici | |
| 2014/0028501 A1 | 1/2014 | Cariou et al. | |
| 2014/0029215 A1 | 1/2014 | Cariou et al. | |

FOREIGN PATENT DOCUMENTS

| | | | | |
|---|---|---|---|---|
| CN | 101060197 A | 10/2007 | | |
| CN | 101488769 A | 7/2009 | | |
| CN | 101783433 A | 7/2010 | | |
| CN | 201910481 | * | 7/2011 | H01Q 1/24 |
| CN | 201910481 U | 7/2011 | | |
| CN | 202019351 U | 10/2011 | | |

OTHER PUBLICATIONS

Traslation of Wu CN 201910481.*
Chinese Notification of Grant of Patent Right for Utility Model dated Feb. 21, 2014 for CN Patent Application No. 201320452613.X, with English Translation, 5 pages.
Chinese Notification of Grant of Patent Right for Utility Model dated Oct. 31, 2013 for CN Patent Application No. 20132045179.4, with English Translation, 4 pages.
Chinese Notification of Grant of Patent Right for Utility Model dated Jan. 30, 2014 for CN Patent Application No. 201320447881.2 with English Translation, 5 pages.
Non-Final Office Action dated Dec. 10, 2014 for U.S. Appl. No. 13/671,224, 10 pages
Chinese Office Action dated Jan. 22, 2015 for CN Patent Application No. 201310319771.2, with English translation, 16 pages.
Final Office Action dated Jun. 18, 2015 for U.S. Appl. No. 13/671,224, 13 pages.
Chinese Office Action dated Apr. 3, 2015 for CN Patent Application No. 201310316711.5, with English translation, 23 pages.
Chinese Office Action dated Jan. 26, 2015 for CN Patent Application No. 201310320996.X, with English translation, 19 pages.
Non-Final Office Action dated Mar. 10, 2015 for U.S. Appl. No. 13/671,086, 22 pages.
Final Office Action dated Sep. 3, 2015 for U.S. Appl. No. 13/671,086, 21 pages.
Final Office Action for U.S. Appl. No. 13/671,224 dated Jul. 5, 2016, 14 pages.
Final Office Action for U.S. Appl. No. 13/671,086 dated Jul. 11, 2016, 22 pages.
Final Office Action for dated Jul. 5, 2016 for U.S. Appl. No. 13/671,224, 14 pages.
Final Office Action dated Jul. 11, 2016 for U.S. Appl. No. 13/671,086, 25 pages.
Non-Final Office Action dated Feb. 3, 2017 for U.S. Appl. No. 13/671,086, 14 pages.
Chinese Second Office Action dated Oct. 8, 2015 for CN Patent Application No. 201310320996.X, with English Translation, 5 pages.
Chinese Second Office Action dated Oct. 13, 2015 for CN Patent Application No. 201310319771.2, with English Translation, 6 pages.
Chinese Second Office Action dated Nov. 24, 2015 for CN Patent Application No. 201310316711.5, with English Translation, 7 pages.
Non-Final Office Action dated Dec. 3, 2015 for U.S. Appl. No. 13/671,224, 14 pages.
Non-Final Office Action for U.S. Appl. No. 13/671,086, dated Dec. 22, 2015, 20 pages.
Notification on Grant of Patent Right dated Apr. 6, 2016 for CN Patent Application No. 201310320996.X, with English Translation, 6 pages.

* cited by examiner

WIRELESS COMMUNICATIONS ANTENNA ASSEMBLY

CROSS-REFERENCES TO RELATED APPLICATIONS

This application is a non-provisional application of and claims the benefit of priority of U.S. Provisional Application No. 61/676,778, filed on Jul. 27, 2012, which is herein incorporated by references in its entirety for all purposes.

This application is related to commonly owned and concurrently filed U.S. patent application Ser. No. 13/671,086, titled, "3-D Antenna for Wireless Communications," and U.S. patent application Ser. No. 13/671,224, titled, "Wireless Communications Apparatus," the entire contents of which are herein incorporated by reference in their entirety for all purposes.

BACKGROUND OF THE INVENTION

Wireless USB is a short-range wireless radio communication protocol. It was designed to operate in the 2.0 to 10.6 GHz frequency range. Wireless USB may be used for wireless communication between a computer and computer peripheral devices such as mice, keyboards, printers and scanners, as well as for communicating with game controllers, digital cameras, portable media players, hard disk drives and flash drives.

Other commercial wireless transceivers for providing wireless communication between a computer and peripheral devices use other standards such as Firewire (IEEE 1394) and the mini-USB standard. These other standards use a form factor with a different plug size.

A "nano" dongle is a USB dongle of a particular form factor in which the end cap protrudes beyond the socket surface by about 6.8 mm. A "pico" dongle is a USB dongle of a particular form factor in which the end cap protrudes beyond the socket surface by an amount less than a nano dongle. Thus, the length of the pico dongle end cap is less than the length of a nano dongle. A pico dongle form factor is desirable because it is convenient to leave the dongle plugged into a laptop or other mobile computing device rather than inserting the dongle before each use and removing the dongle before transporting the mobile computing device. Having the endcap of a dongle almost flush with the edge of a mobile computing device reduces the likelihood that the dongle may be damaged while the mobile computing device is in transit. However, creating a small dongle that has a sufficient radiation pattern and power may be a challenge. The size of a dongle limits the size of the electronics that may be used, especially the size of the antenna, which typically affects the radiation pattern. Thus, an improved antenna design is sought.

SUMMARY OF THE INVENTION

Certain embodiments of the invention relate to a method for constructing a wireless communications apparatus, the method including attaching a three dimensional antenna having a first end and a second end to a printed circuit board (PCB) using a spring-loaded attachment mechanism, wherein the three dimensional antenna is attached in an orientation that is perpendicular to a mounting surface of the PCB. The method can further include soldering the first end of the three dimensional antenna to the PCB.

Other embodiments of the invention relate to a wireless communications apparatus including a PCB notched at one end with one or more notches. The wireless communications apparatus may also include an antenna that is spring-loaded into the one or more notches on the PCB, a portion of the antenna adhered to the PCB to form a subassembly. The wireless communications apparatus may also include a housing that encases the subassembly, the housing comprising a plug operable for insertion into a socket housed in an electronic device.

Other embodiments of the invention relate to a method for constructing a wireless communications apparatus, the method including locking a first portion of an antenna device to a printed circuit board (PCB) by placing the antenna device into grooves inset into the PCB. The method can further include attaching a second portion of the antenna device to a bracket housing the PCB to form a subassembly.

BRIEF DESCRIPTION OF THE DRAWINGS

FIGS. 8A-8D are simplified diagrams illustrating components of a USB dongle at stages of assembly, according to an embodiment of the invention.

DETAILED DESCRIPTION OF THE INVENTION

Figure 1:
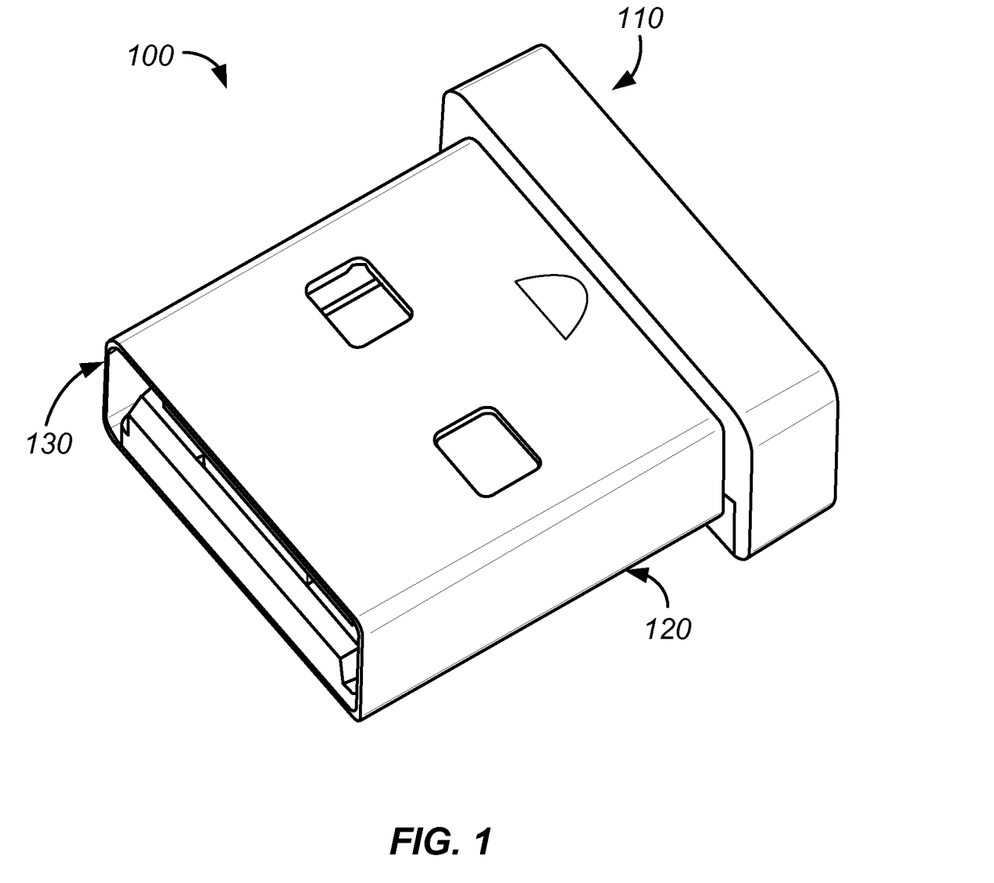
FIG. 1 is a simplified diagram of a USB dongle, according to an embodiment of the invention.

FIG. 1 is a simplified diagram of a USB dongle, according to an embodiment of the invention. Dongle 100 comprises two main parts: plug 120 and end cap 110. Plug 120 comprises a printed circuit board (PCB) encased in a metallic shell 130. The plug 120 inserts into a USB port on an electronic device. Plug 120 may plug directly into a device such as a personal computer or a laptop computer, or plug 120 may plug into a device, which is connected to a computing device. End cap 110 protrudes out from the USB socket. End cap 110 may be slightly wider than plug 120, or end cap 110 may be the same width as plug 120. A wider end cap would be able to house a larger antenna. Also, end cap 110 provides a place for gripping the dongle for insertion into and removal from the USB port. A wider end cap also gives more of an area under which to slide fingertips in order to grip the dongle for unplugging from the device.

In an alternate embodiment, the dongle module may use a different kind of mechanical plug such as Firewire, HDMI, or mini-USB. The components within a dongle of one of these alternative form factors, or any other form factor, may be scaled appropriately for the form factor. For example, the PCB and/or the antenna may be larger than the PCB and antenna described in the specific examples herein. In addition, dongles of different embodiments may replace or omit certain components described in the example herein. For example, a dongle may omit the metallic shell in favor of using a shell of plastic or other material, or may provide a different way to secure the endcap to the PCB without using a shell.

Figure 2:
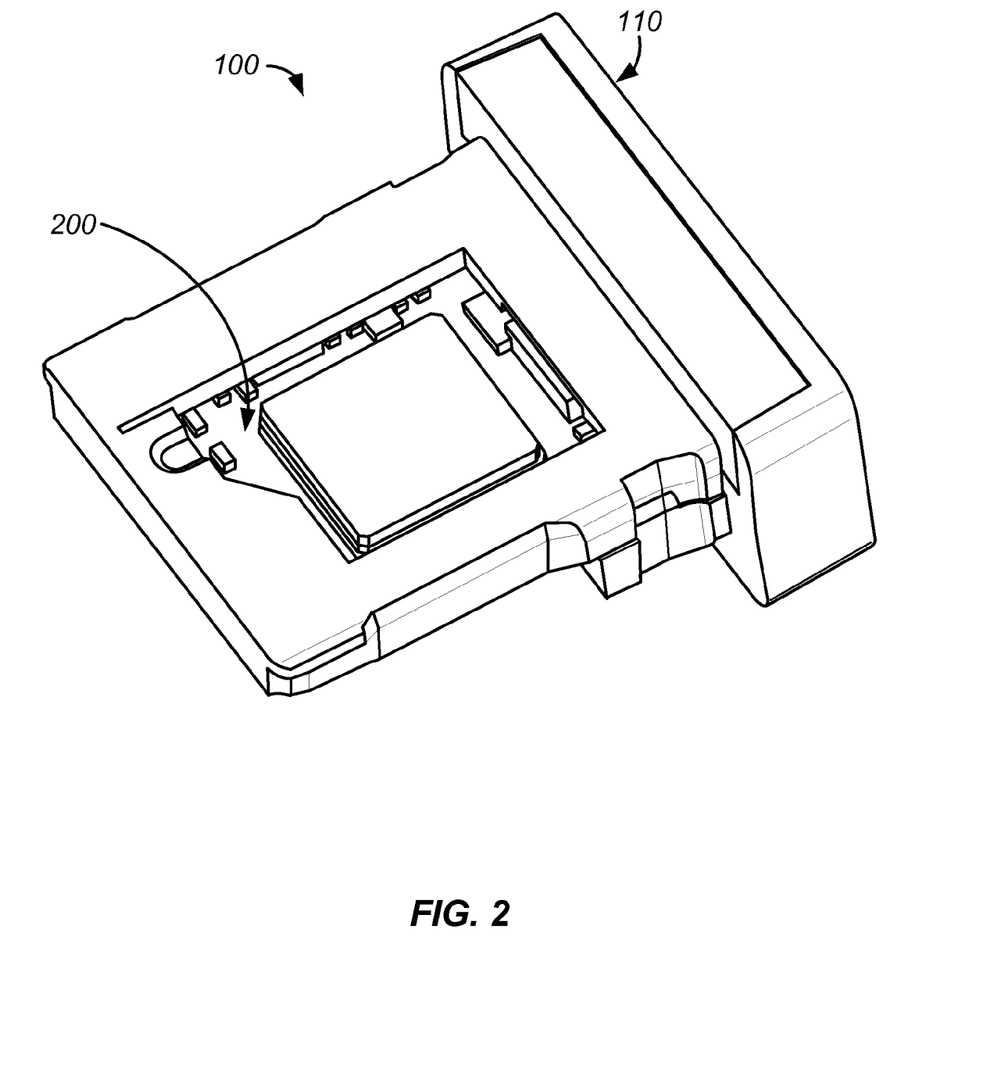
FIG. 2 is a simplified diagram of a USB dongle with the metallic shell removed, according to an embodiment of the invention.

FIG. 2 is a simplified diagram of dongle 100 viewed from the bottom with the metallic shell 130 removed from the plug, according to an embodiment of the invention. Removing the metallic shell from the plug exposes PCB 200.

Figure 3A:
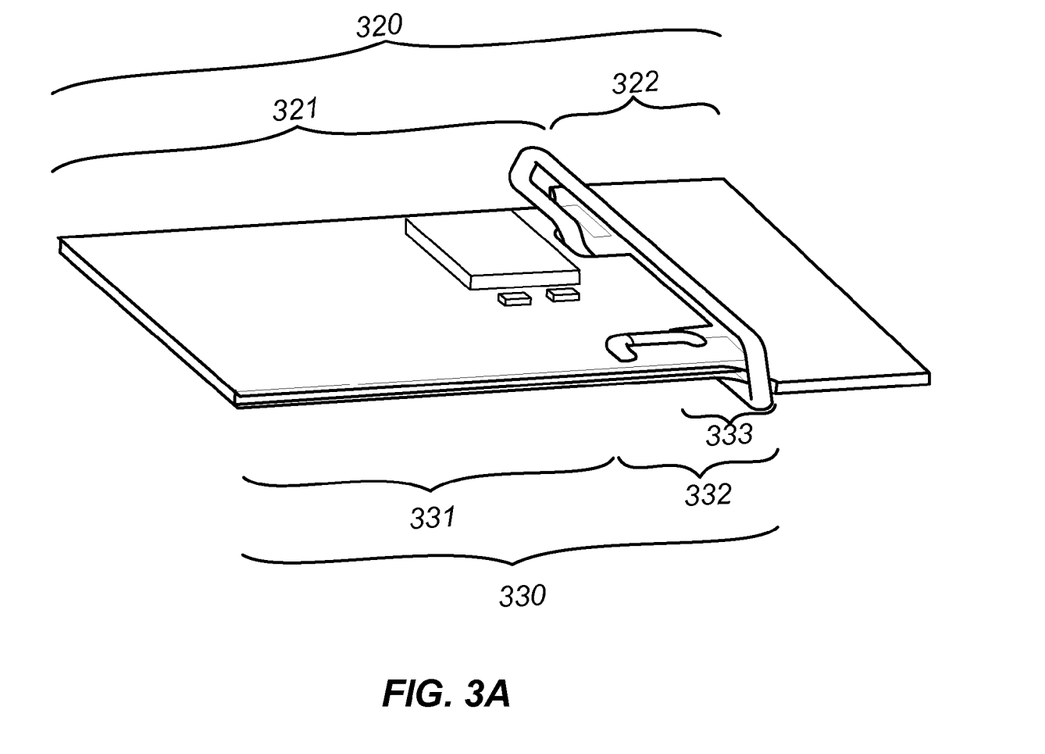
FIG. 3A is a simplified diagram illustrating the difference between a nano dongle and a pico dongle regarding the size of the PCB and layout of the antenna, according to an embodiment of the invention.

FIG. 3A is a simplified diagram illustrating the difference between a reference nano dongle and a pico dongle regarding the size of the PCB 200 and layout of the antenna, according to an embodiment of the invention. Length 320 indicates the length of PCB 200 in a reference nano dongle form factor. Length 320 includes the plug length 321 and the endcap length 322 for the reference nano dongle. For the reference nano dongle the antenna is printed on the PCB 200 within the endcap portion (length 322), and is thus in the same plane as the PCB 200. A metallic shell generally covers the plug length 321. The antenna printed on endcap length 322 is not covered by the metallic shell. In other reference nano dongles, a trace can connect the antenna to internal circuitry located inside the metallic shell, thereby providing part of the antenna within plug length 321. The proximity and overlap of a metallic shell with an antenna impacts the radiation pattern, because a metallic sheath may block or interfere with an antenna's radiation pattern. An endcap may be applied over the length 322 of the PCB 200 to cover and protect the antenna.

Dimension 330 illustrates the length of the PCB 200 in a pico dongle comprising the length of plug 331 and the length of the antenna 332. In some embodiments, the length of plug 331 in the pico dongle is roughly the same as the length of 321 in the nano dongle. The length of the antenna 332 includes a length of antenna 300 orientated perpendicular to the PCB 200 and a tail portion that is soldered to the PCB 200, according to an embodiment of the invention. The vertical portions are illustrated in FIG. 3A are tilted in accordance with a perspective view, although the vertical portions can extend up and down with respect to the plane of the PCB 200. Dimension 333 illustrates the length of the generally perpendicular portion of the antenna 300 with respect to the PCB 200, not including the soldered extension. An endcap may be applied over and/or around the some or all of the antenna 300 to cover the antenna 300 and for protection. The endcap may be made of plastic, or another material that would not significantly reduce the wireless transmission or reception properties of the antenna 300. The endcap may also isolate some or all of the antenna 300 from the metallic shell enclosing the PCB 200, reducing the interference that it may cause. In some embodiments, the length of the antenna portion 332 of the pico dongle is about half of the antenna portion 322 of the reference nano dongle. The pico dongle, according to embodiments of the invention, provides performance and a radiation patterns similar to reference nano dongles, but with a shorter antenna portion extending beyond the metallic shell. The configuration of the pico dongle, according to embodiments of the invention, provides benefits that cannot be achieved using the reference nano dongle. For example, reducing the length of the antenna portion 322 of the reference nano dongle would result in poorer signal strength and radiation pattern. If the antenna portion of the reference nano dongle were to be maintained, but partially inserted within the metallic shell to achieve the same overall length as a pico dongle, the performance would again be reduced due to interference from the metallic shell.

Figure 3B:
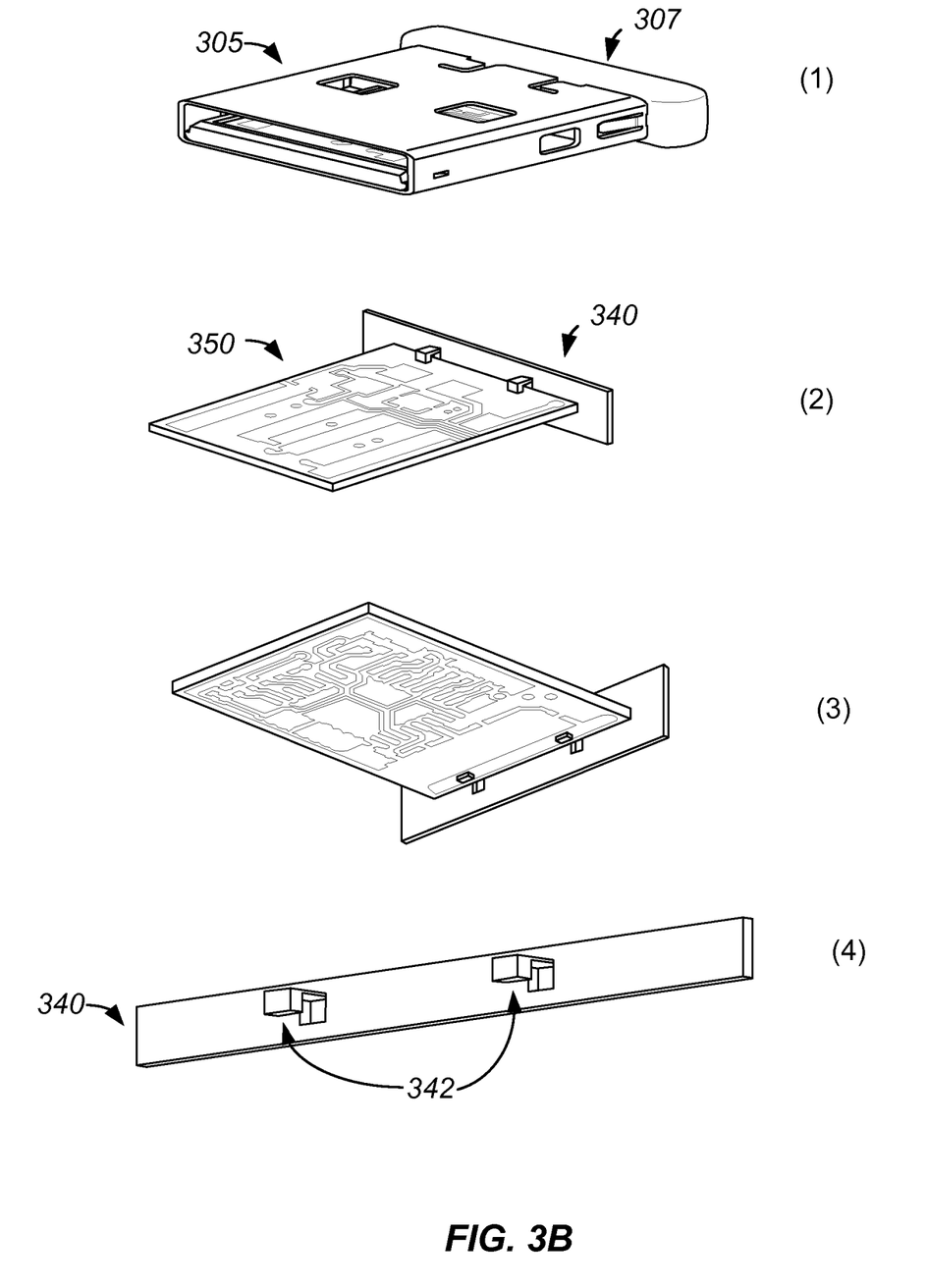
FIG. 3B is a simplified diagram illustrating perspective views of a pico dongle with a two dimensional (2D) metallic plate antenna, according to an embodiment of the invention.

FIG. 3B provides simplified perspective views of a pico dongle with a two dimensional (2D) metallic plate antenna according to an embodiment of the present invention. FIG. 3B(1) illustrates a perspective view of a pico dongle as a complete package. The two dimensional (2D) metallic plate antenna is located inside endcap 307. FIG. 3B(2) is a perspective view from the same angle as that in FIG. 3B(1), but with metallic shell 305 and the endcap 307 removed, exposing the PCB 350 and antenna 340. FIG. 3B(3) is a perspective view from the underside of the device illustrated in FIG. 3B(2). FIG. 3B(4) is a perspective view of the antenna, illustrating the clipping mechanism used to attach the antenna to the PCB. Orienting the plate antenna 340 perpendicular to PCB 350 allows the antenna to fit within a shorter pico endcap. The perpendicular orientation also provides a quasi-3D performance.

Because the illustrations are not drawn to scale, the plate antenna illustrated in FIG. 3B(2) appears to not fit in the endcap illustrated in FIG. 3B(1). However, as will be evident, the plate antenna does, in fact, fit in the endcap. Further, as illustrated in FIG. 3B(4), clips 342 are attached to the antenna 340 to enable the antenna to be joined to the PCB at appropriate coupling locations. Although two clips 342 are illustrated, additional or fewer clips can be utilized depending on the particular device geometry and design.

Figure 3C:
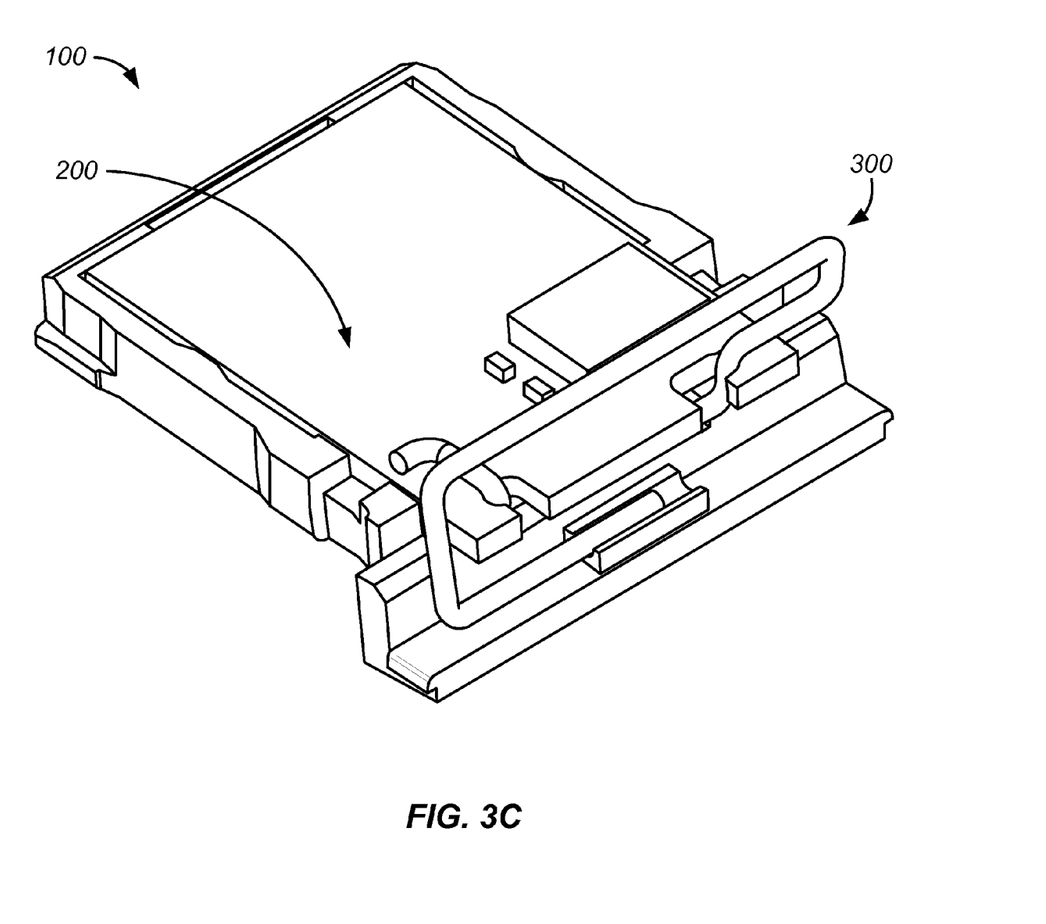
FIG. 3C is a simplified diagram of a pico dongle with the end cap removed showing a three-dimensional (3D) wire antenna, according to an embodiment of the invention.

FIG. 3C is a simplified diagram of a pico dongle with the end cap removed showing a three-dimensional (3D) wire antenna 300, according to an embodiment of the invention. The shape of wire antenna 300 overcomes the limitation of its size by radiating in three dimensions. The shape of the antenna as well as its placement and orientation within the dongle affects the radiation pattern. The antenna can be adjusted/optimized based on desired form factor. In some embodiments, a minimum distance between the antenna and shield (i.e., metallic shell 130 illustrated in FIG. 1) is utilized to avoid shunting of current.

Figure 3D:
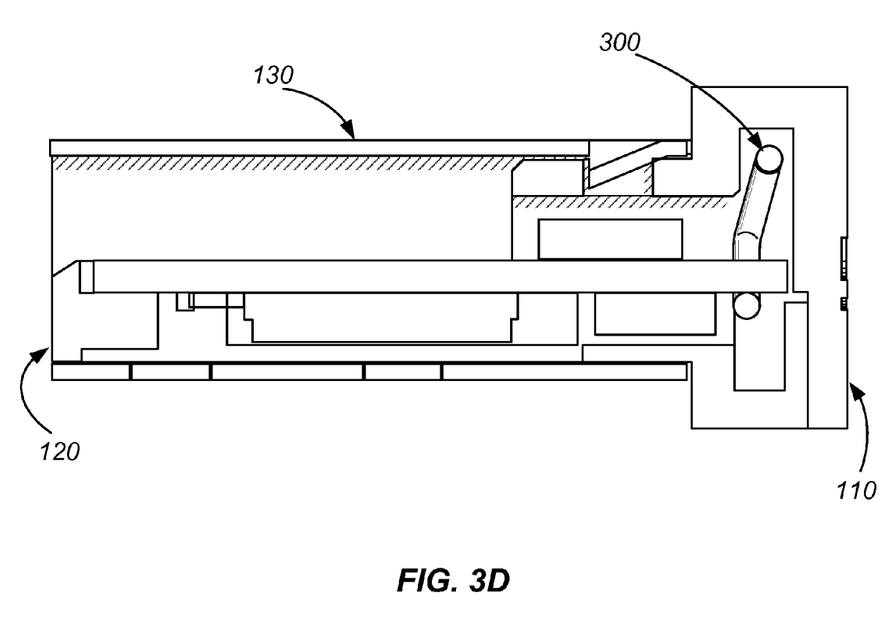
FIG. 3D is a simplified side view diagram of a pico dongle illustrating a spatial separation between the antenna and the shield according to an embodiment of the present invention.

FIG. 3D is a simplified side view diagram of a pico dongle illustrating a spatial separation between the three-dimensional (3D) wire antenna 300 and the shield 130 according to an embodiment of the present invention. The minimum distance may be based on the thickness of the end cap housing 110. In an embodiment, the plastic end cap 110 may be about 0.8 mm thick. A thinner housing may reduce the minimum distance, and thus, the length of the end cap 110. In an embodiment, the antenna 300 may be no wider and/or higher than the plug 120. In such an embodiment, the antenna 300 may retract into the plug 120 when not in use and extend outside of the plug 120 when in use.

Figure 4:
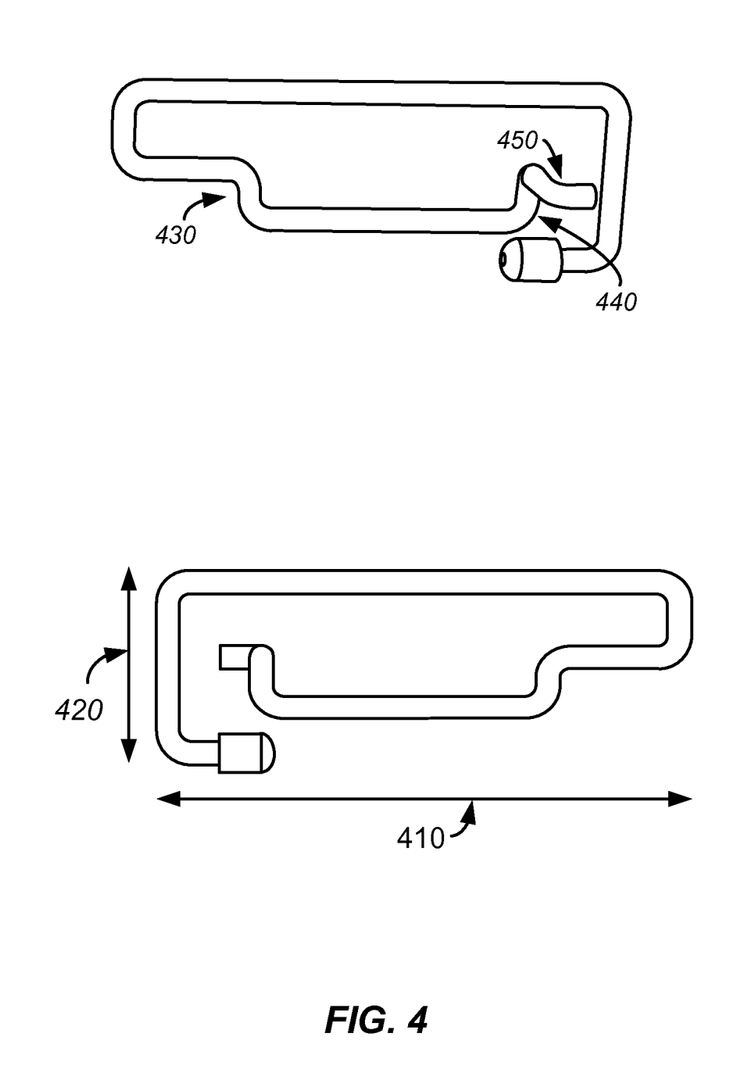
FIG. 4 is a simplified diagram illustrating the three dimensions of the wire antenna, according to an embodiment of the invention.

In an embodiment, the antenna may be three dimensional and made of wire, resembling the shape of a paper clip that has been bent so that it no longer lies flat. The length 333 of the antenna, as illustrated in FIG. 3A, is about 1.8 mm which is less than the 3 mm length of a typical pico dongle endcap. FIG. 4 is a simplified diagram illustrating the height and width dimensions of wire antenna 300, according to an embodiment of the invention. In FIG. 4, the illustrated dimensions are labeled as width 410 and height 420. Width 410 may be the same or larger than the standard USB socket of 12 mm because the width of the endcap may be wider than the width of the USB socket. In the embodiment illustrated, the width of the antenna is about 11.75 mm, and the end cap is slightly wider than the USB socket. In order for antenna 300 to be outside of the metallic shell surrounding the PCB in the plug portion of the dongle, the end cap that protrudes from the plug must be at least as long as antenna length 333. In the illustrated embodiment, height 420 is an indication of the vertical dimension of the antenna when the PCB is in a horizontal orientation. The antenna may be mounted with a portion above the PCB and a portion underneath the PCB. The height 420 of the antenna is the minimum thickness of the endcap. In the illustrated embodiment, height 420 is about 4 mm. Thus, the pico dongle that houses this example antenna 300 may be slightly thicker (i.e. taller) than it is long.

Such a 3D antenna may have a radiation pattern that allows improved ability to receive a signal from a transmitter and providing more flexibility regarding placement of the transmitter. The combination of removing the antenna from the metallic shell covering the plug and shaping the antenna to be three dimensional greatly enhances the effective radiation pattern and power of the dongle.

The size of the 3D antenna is not limited to the dimensions described in the example. For example, a dongle in a HDMI form factor may be used with audio/video equipment, such as a television. Such a dongle may be plugged into the back of the television where size may be constrained. Thus, the antenna within a dongle may be smaller than other types of wireless antennas used for televisions. The antenna design and dimensions may also be adjusted to provide increased signal power. Thus, there may be different applications of a wireless communication device that require different sizes and configurations for a 3D wire antenna mounted perpendicular to a PCB. Further, the dongle may be used to connect to one device, or to multiple devices simultaneously. The devices that connect to the dongle may be of any suitable type, such as but not limited to a computer mouse, keyboard, video camera, audio/video receiver, audio headphones, cable box, desktop or mobile computer, smart phone, and tablet. In some embodiments the dongle may be configured differently depending on which type of device it is intended to connect to.

Figure 5:
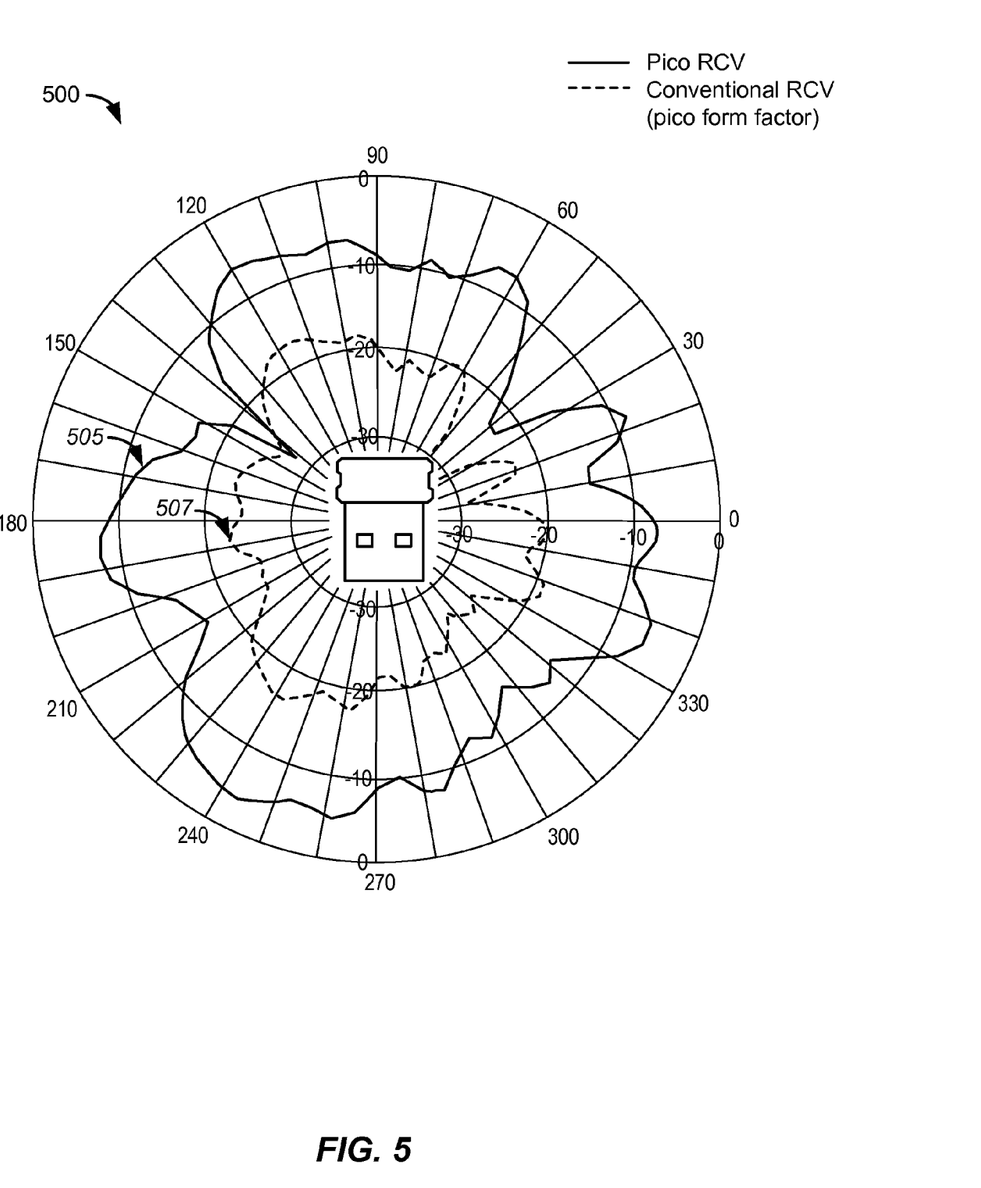
FIG. 5 is a graph showing the measured radiation patterns and power for a 3D pico dongle as compared to a 2D pico dongle, according to an embodiment of the invention.
Figure 6:
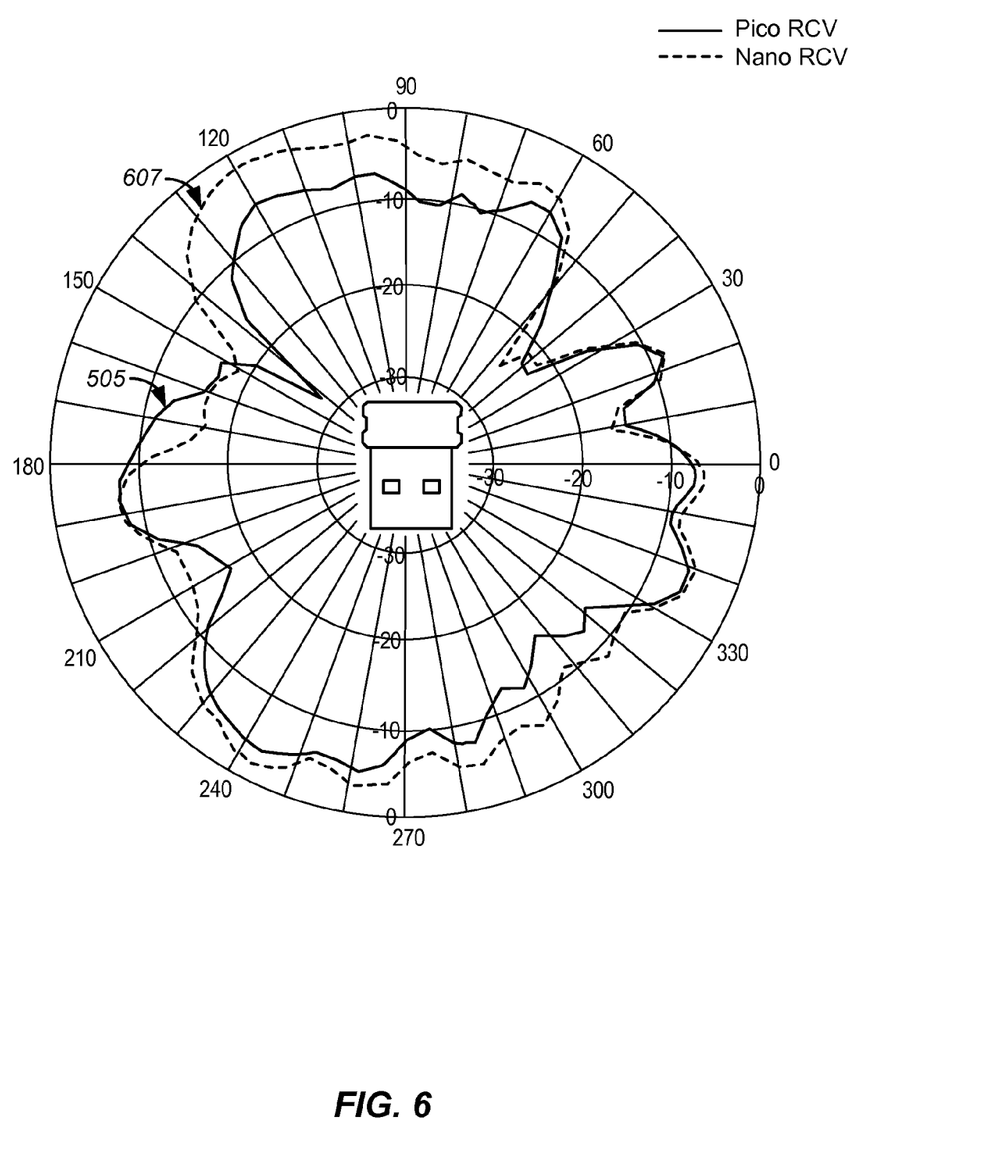
FIG. 6 is a graph showing the measured radiation patterns and power for a 3D pico dongle compared to a 2D nano dongle, according to an embodiment of the invention.

FIGS. 5 and 6 each illustrates the radiation pattern for a dongle provided according to an embodiment of the invention, as compared to two different conventional dongles respectively. In each figure, the dongle provided according to an embodiment of the invention is a pico dongle housing a 3D wire antenna. To create the radiation pattern graph for each dongle, the power was measured while the dongle was attached to the same USB port of a particular laptop computer.

FIG. 5 is a graph illustrating a radiation pattern (507) for a first conventional dongle that is a pico dongle with a 2D antenna. Radiation pattern (505) was measured for the dongle according to an embodiment of the invention (hereinafter shortened to "pico dongle with 3D antenna" or simply "3D antenna"). As can be measured using the figure, the average difference in radiation signal between the 3D antenna and the first conventional dongle is +12 dB. Thus, comparing the 3D antenna to a 2D antenna in dongles of the same form factor shows that the 3D antenna outperforms the 2D antenna.

FIG. 6 is a graph illustrating the measured radiation pattern (607) for a second conventional dongle as compared to the radiation pattern of the 3D antenna (505). The second conventional dongle is a 2D nano dongle. The antenna in the 2D nano dongle is printed on the PCB. As can be seen in the graph, the performance of the 3D antenna allows the smaller dongle to perform almost as well as the larger dongle with only a 2 dB difference on average.

Figure 8A:
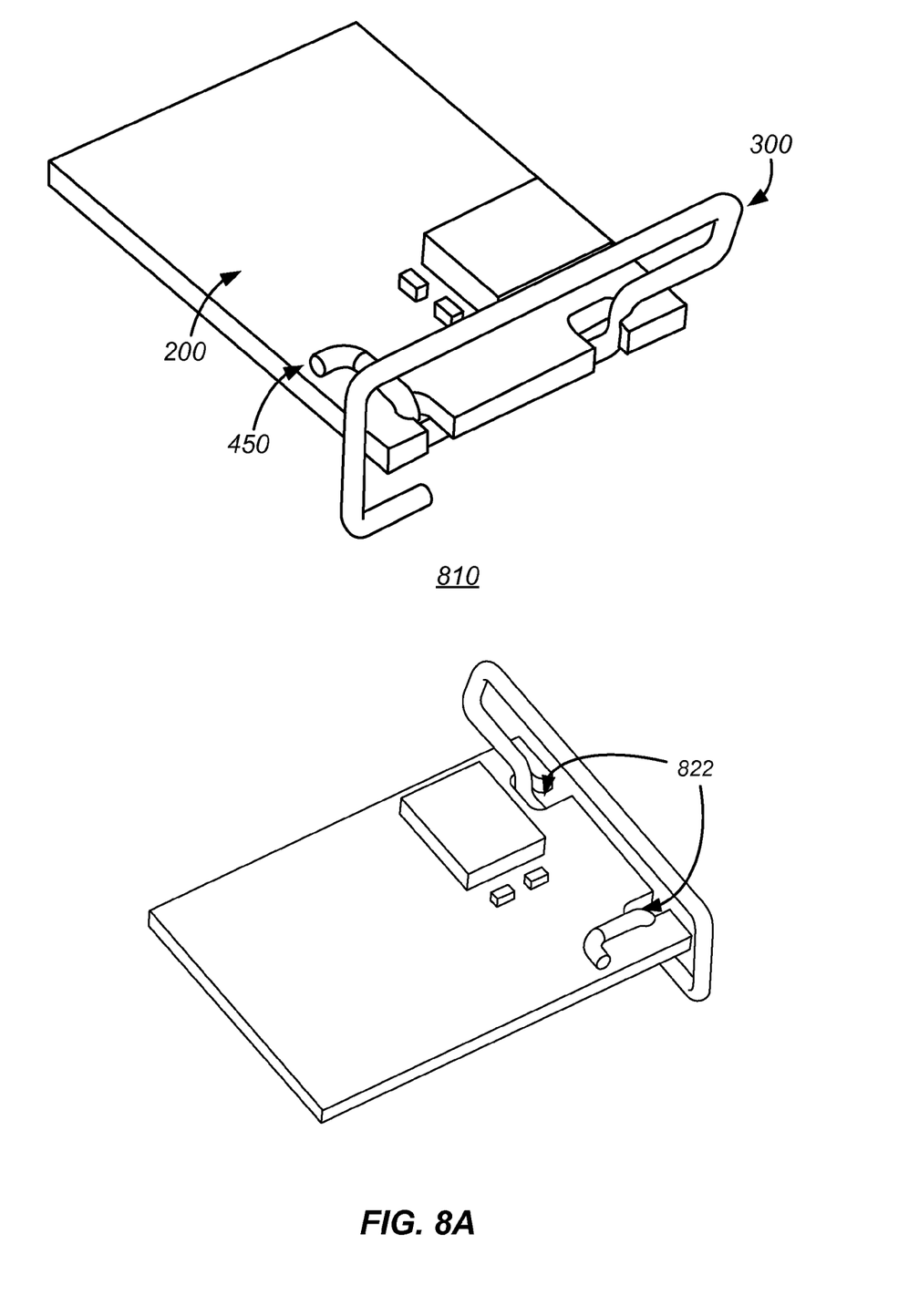
FIG. 8A illustrates a 3D wire antenna mounted on a PCB.

FIGS. 8A-8D are simplified diagrams illustrating components of a USB dongle at stages of assembly, according to an embodiment of the invention. FIG. 8A illustrates a 3D wire antenna mounted on a PCB. Subassembly 810 comprises the antenna 300 attached to the PCB 200. Antenna 300 has spring-like properties. The antenna is compressed laterally to line up with the notches in the end of the PCB. Once the antenna is inserted, the spring force acts laterally in the arrow directions to hold the antenna in place while an end of the antenna 450 is soldered to the PCB.

Figure 8B:
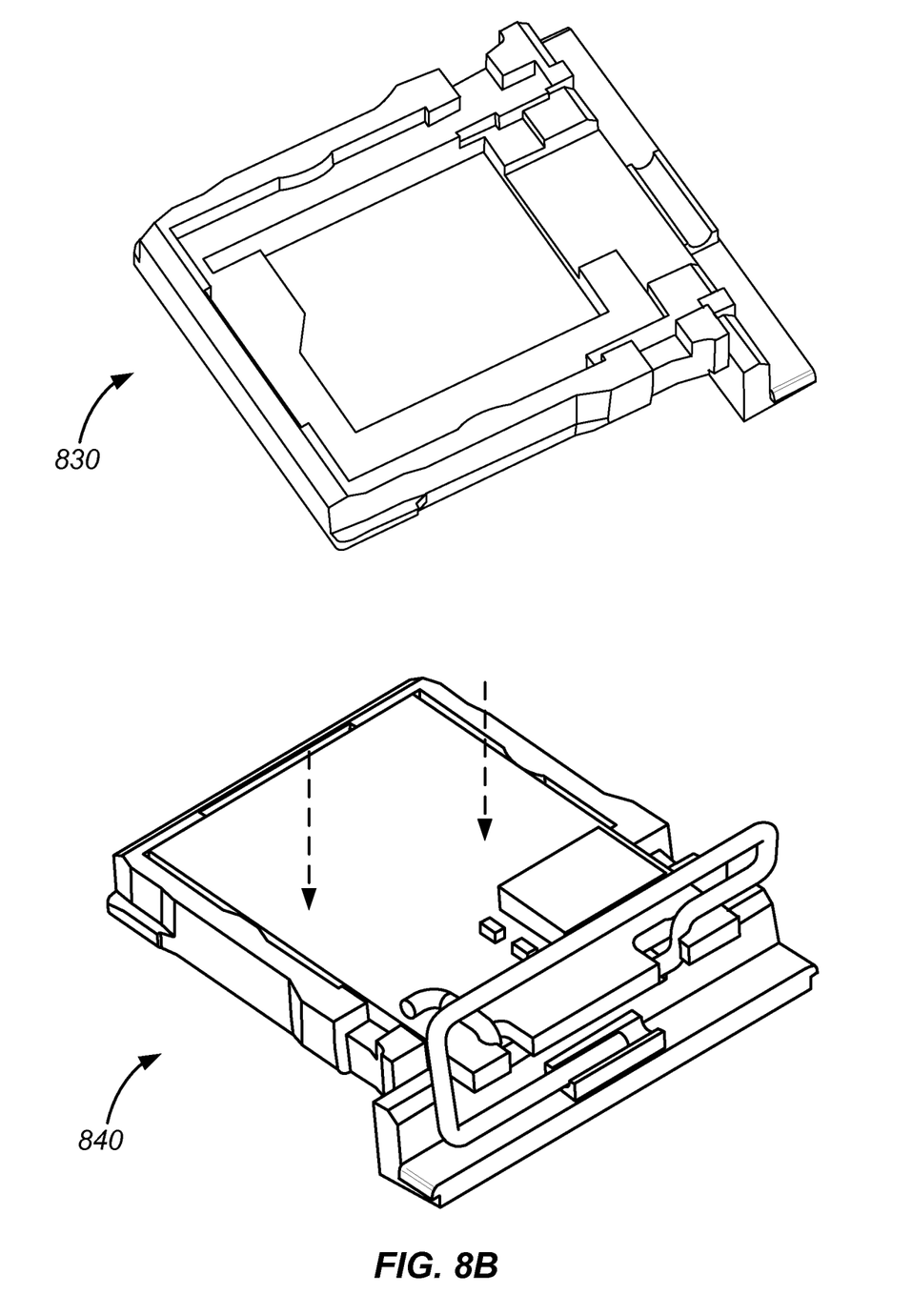
FIG. 8B illustrates the PCB/antenna subassembly mounted into a bracket.

FIG. 8B illustrates subassembly 840 which is constructed by placing subassembly 810 into a bracket 830.

Figure 8C:
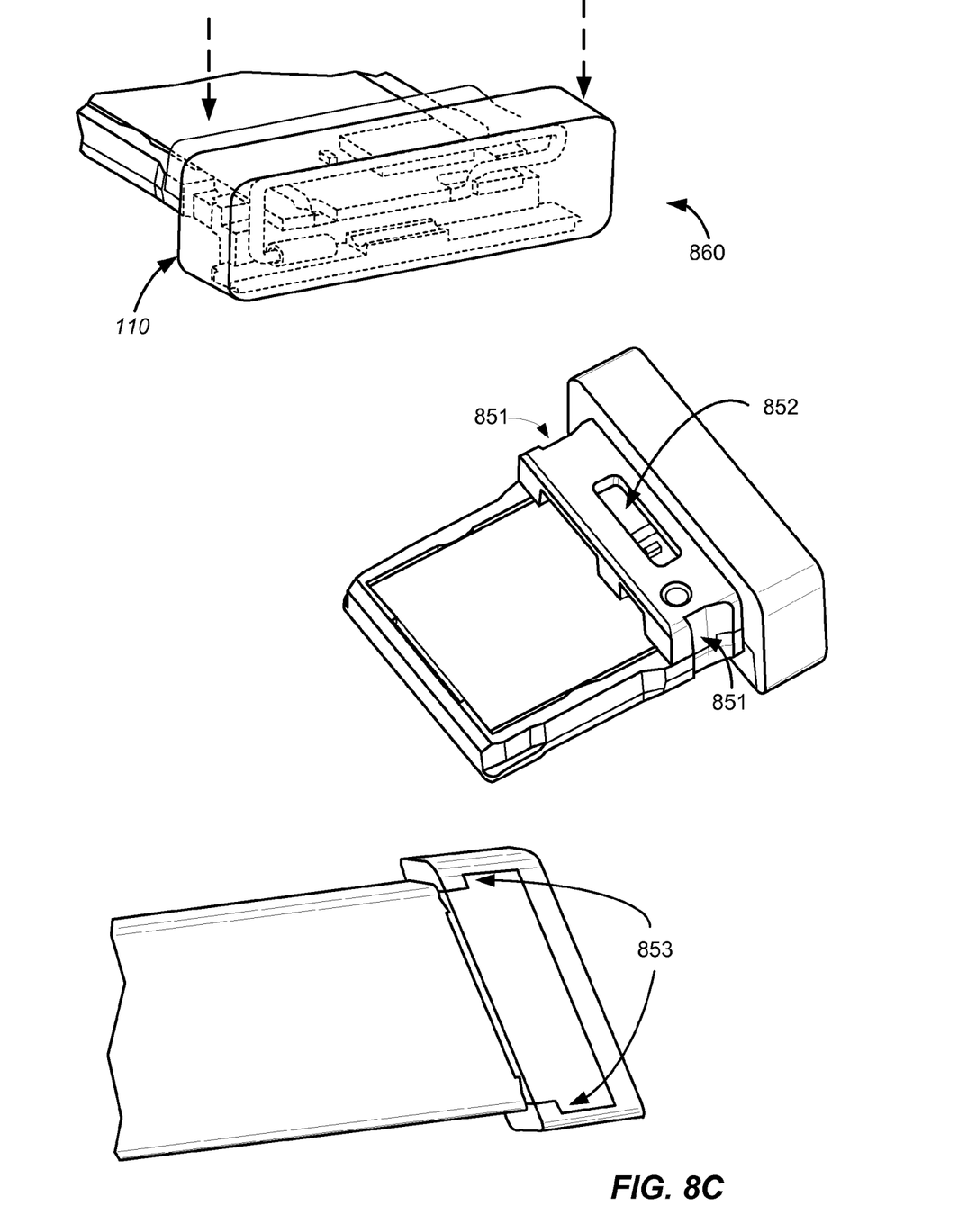
FIG. 8C illustrates the installation and placement of the endcap.

FIG. 8C illustrates the placement of the endcap. Endcap 110 covers antenna 300 and allows for a user to hold the dongle for insertion and removal of the dongle into and out of a USB socket. There are two portions to the endcap: a thicker portion that is useful for gripping the dongle with fingers, and a thinner portion that partially extends over the PCB. The thinner portion of endcap 110 has two recesses 851 and 852 on the side and top respectively. The endcap is placed onto the bracket from the top and snaps into the bracket at 853, seen from the bottom of the bracket.

Figure 8D:
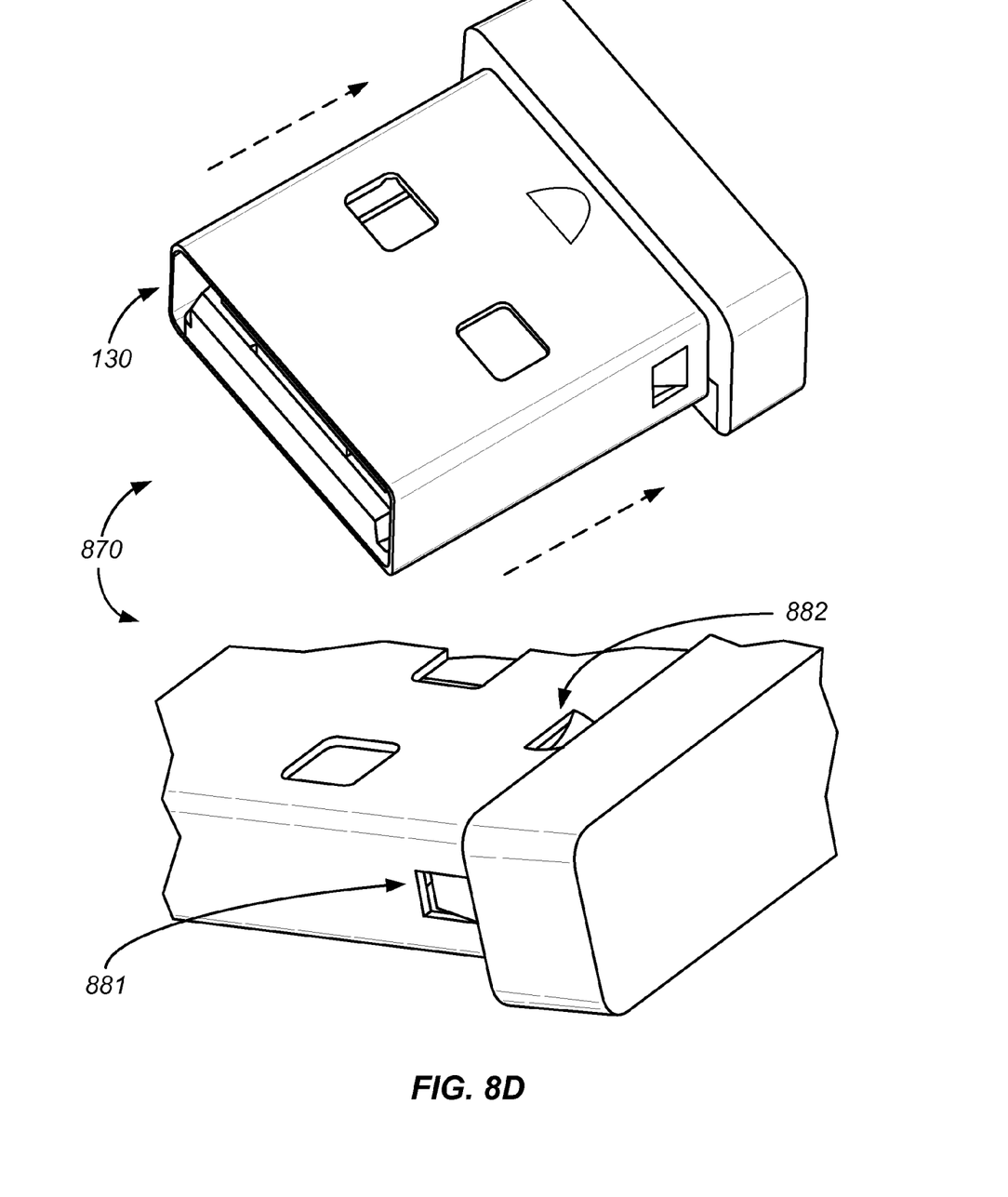
FIG. 8D illustrates the placement of the metallic shell.

FIG. 8D illustrates the placement of the metallic shell over the plug. The top and bottom illustrations view the same subassembly 870 from different angles. In subassembly 870, metallic shell 130 encases a portion of the PCB and forms the plug that inserts into the USB socket. Metal clip 882 on the top of the metallic shell snap fits into recess 852 on the endcap, and metal clips 881 on both sides of the metallic shell snap fit into corresponding recesses 851 on the sides of the endcap.

Figure 7:
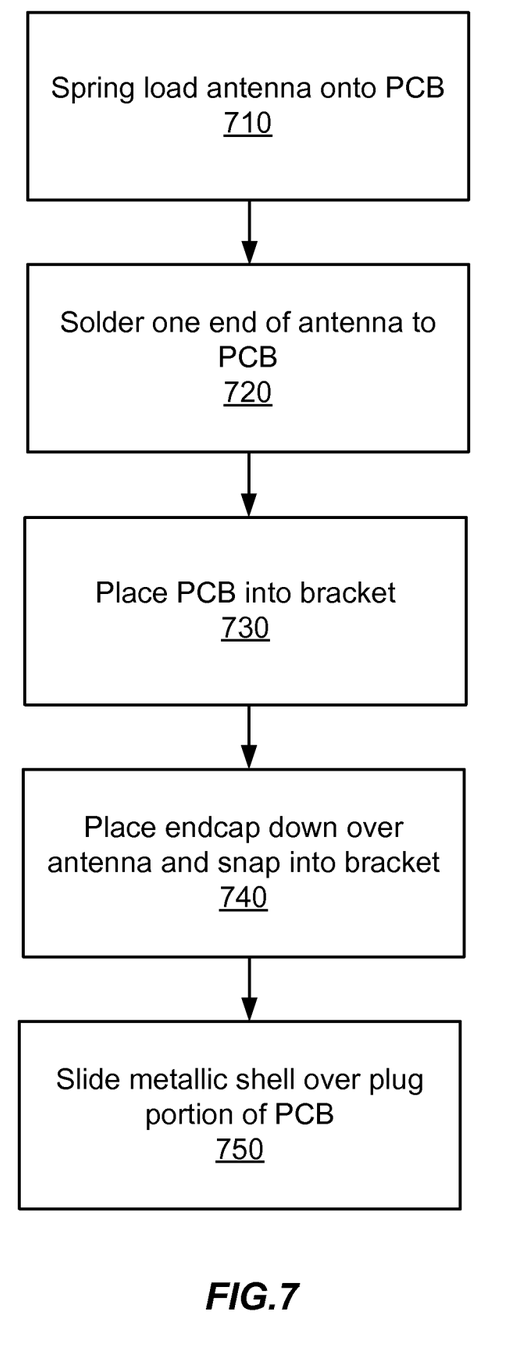
FIG. 7 is a simplified flow diagram of the steps for assembling a dongle using the components illustrated in FIGS. 8A-8D, according to an embodiment of the invention.

FIG. 7 is a simplified flow diagram of the steps for assembling a USB dongle that refers to the components and subassemblies shown in FIGS. 8A-d, according to an embodiment of the invention. For purposes of describing these assembly steps, the PCB is assumed to be oriented in a horizontal position and the antenna oriented in a vertical position, though the assembled dongle may be used in other orientations. The length of the wire segment between vertical portions 430 and 440 of the wire antenna is slightly greater than the distance between notches 822 on the PCB. In Step 710, the 3D antenna is spring loaded onto a PCB to form subassembly 810. To attach the antenna to the PCB, vertically oriented portions of the wire antenna 430 and 440 may be squeezed towards each other close enough so that the vertical portions can be inserted into notches 822 on the PCB. Once the wire antenna portions 430 and 440 are inserted into the PCB notches 822, the spring force acts laterally (parallel to width 410) to hold the antenna in place while a horizontally oriented portion 450 of the antenna is soldered to the PCB in Step 720. Thus, the PCB itself serves as a holding fixture during soldering, obviating the need for another plastic part to hold the antenna in place as well as removing the need for extra space on the PCB to place a soldering fixture during this assembly step. Also, the spring loading of the antenna onto the PCB allows for easy assembly of a very small part. This design allows the 3D antenna shape to occupy a minimal space and yet provide a maximal RF pattern.

In Step 730, subassembly 810 is inserted into bracket 830 from the top creating subassembly 840. In Step 740, the endcap 110 is placed over the antenna from the top and snaps into subassembly 840. Hooks in the endcap hold the endcap onto the bracket 830 of subassembly 840 to form subassembly 860. Removing the dongle from the USB socket requires holding the endcap and pulling in the direction away from the plug. Snapping the endcap onto the bracket from the top rather than from the end towards the plug avoids the endcap from separating from the dongle upon removing the dongle from the USB socket. In Step 750, the metallic shell 130 slides over the plug end of the dongle towards the endcap 110, overlapping a portion of the endcap and holding the endcap securely onto the dongle. Clips in the metallic shell snap into recesses on the sides of the bracket and the top of the overlapped portion of the endcap respectively. The entire assembly of the dongle may be performed without glue or other additional adhesive substance other than soldering the antenna to the PCB. This reduces the parts and time required for assembly.

It should be appreciated that the specific steps illustrated in FIG. 7 provide a particular method of assembling a wireless communications dongle according to an embodiment of the present invention. The individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for constructing a wireless communications apparatus for communication between a computing device and a corresponding peripheral device, the method comprising:
   laterally compressing a three dimensional antenna having a first end and a second end;
   inserting the three dimensional antenna, while compressed, into one or more notches in one end of a printed circuit board (PCB), wherein the three dimensional antenna is attached in an orientation that is perpendicular to a mounting surface of the PCB;
   releasing the three dimensional antenna to secure the three dimensional antenna to the mounting surface of the PCB; and
   soldering the first end of the three dimensional antenna to the PCB.

2. The method of claim 1 further comprising placing the PCB into a bracket.

3. The method of claim 2 further comprising encasing the three dimensional antenna within a plastic end cap that snaps into the bracket.

4. The method of claim 1 further comprising encasing a portion of the PCB within a metallic shell, wherein the three dimensional antenna comprises a loop portion adjacent to the second end of the three dimensional antenna and oriented perpendicular to the mounting surface of the PCB, wherein the loop portion is not encased within the metallic shell.

5. The method of claim 1 wherein the antenna is a wire antenna.

6. The method of claim 5, further comprising inserting particular vertical portions of the antenna into the one or more notches.

7. The method of claim 6 further comprising:
   after inserting the particular vertical portions of the antenna into the one or more notches, releasing the antenna,
   wherein a spring force of the compressed antenna exerted against edges of the notches causes the antenna to be joined to the PCB.

8. A method for constructing a wireless communications apparatus in a Universal Serial Bus (USB) device, the method comprising:
   laterally compressing a three dimensional antenna having a first end and a second end;
   inserting the three dimensional antenna, while compressed, into one or more notches in one end of a printed circuit board (PCB), wherein the three dimensional antenna is attached in an orientation that is perpendicular to a mounting surface of the PCB;
   releasing the three dimensional antenna, thereby causing the three dimensional antenna to decompress and provide a securing force to secure the three dimensional antenna to the mounting surface of the PCB; and
   soldering the first end of the three dimensional antenna to the PCB.

9. The method of claim 8 further comprising placing the PCB into a bracket.

10. The method of claim 9 further comprising encasing the three dimensional antenna within a plastic end cap that snaps into the bracket.

11. The method of claim 1 further comprising encasing a portion of the PCB within a metallic shell, wherein the three dimensional antenna comprises a loop portion adjacent to the second end of the three dimensional antenna and oriented perpendicular to the mounting surface of the PCB, wherein the loop portion is not encased within the metallic shell.

12. The method of claim 1 wherein the antenna is a wire antenna.

13. The method of claim 12, further comprising inserting particular vertical portions of the antenna into the one or more notches.

14. The method of claim 13 further comprising:
   after inserting the particular vertical portions of the antenna into the one or more notches, releasing the antenna,
   wherein a spring force of the compressed antenna exerted against edges of the notches causes the antenna to be joined to the PCB.

* * * * *